(12) United States Patent
Hu

(10) Patent No.: US 9,541,273 B2
(45) Date of Patent: Jan. 10, 2017

(54) HEAT DISSIPATION STRUCTURE OF SMD LED

(71) Applicant: Wen-Sung Hu, Tainan (TW)

(72) Inventor: Wen-Sung Hu, Tainan (TW)

( * ) Notice: Subject to any disclaimer, the term of this patent is extended or adjusted under 35 U.S.C. 154(b) by 0 days.

(21) Appl. No.: 14/284,599

(22) Filed: May 22, 2014

(65) Prior Publication Data
US 2015/0338082 A1   Nov. 26, 2015

(51) Int. Cl.
| | | |
|---|---|---|
| F21V 29/50 | (2015.01) | |
| F21V 19/00 | (2006.01) | |
| F21V 29/74 | (2015.01) | |
| H05K 1/02 | (2006.01) | |
| H05K 1/05 | (2006.01) | |
| H05K 3/00 | (2006.01) | |
| F21Y 101/00 | (2016.01) | |

(52) U.S. Cl.
CPC ............ *F21V 29/50* (2015.01); *F21K 9/23* (2016.08); *F21V 19/005* (2013.01); *F21V 19/0055* (2013.01); *F21V 29/74* (2015.01); *H05K 1/0204* (2013.01); *H05K 1/056* (2013.01); *F21Y 2101/00* (2013.01); *H05K 3/0061* (2013.01); *H05K 2201/042* (2013.01); *H05K 2201/10106* (2013.01); *H05K 2201/10401* (2013.01); *H05K 2201/10409* (2013.01)

(58) Field of Classification Search
CPC ...... F21V 29/50; F21K 9/1355; H01L 33/644; H01L 33/642; F24F 3/056
USPC ...................... 257/79, 98; 362/373
See application file for complete search history.

(56) References Cited

U.S. PATENT DOCUMENTS

| | | | | |
|---|---|---|---|---|
| 7,513,652 B2* | 4/2009 | Kim | ............... | G02F 1/133608 |
| | | | | 362/294 |
| 2009/0323346 A1* | 12/2009 | Chang | ............... | H01L 33/642 |
| | | | | 362/294 |
| 2010/0133556 A1* | 6/2010 | Li | ............... | 257/88 |
| 2011/0182074 A1* | 7/2011 | Hemerle | ............... | 362/294 |
| 2012/0002420 A1* | 1/2012 | Imai | ............... | H01L 33/486 |
| | | | | 362/249.02 |

FOREIGN PATENT DOCUMENTS

DE        202010014381 U1    12/2010

* cited by examiner

*Primary Examiner* — Ha Tran T Nguyen
*Assistant Examiner* — Suberr Chi
(74) *Attorney, Agent, or Firm* — Alan D. Kamrath; Kamrath IP Lawfirm, P.A.

(57) ABSTRACT

A heat dissipation structure of an SMD LED includes a substrate, an SMD LED and at least one engaging member. A plurality of conductive copper foils is covered on an upper end face of the substrate. Two electrodes are provided on a lower surface of the SMD LED and are respectively connected to two copper foils on the upper end face. An engaging hole extends through one of the copper foils adjacent the SMD LED and through the substrate. The engaging member is made of high thermal conductive metal and is engaged in the engaging hole to combine the copper foil and the substrate. Accordingly, heat generated by the SMD LED can be directly transferred to an exposed lower end face of the substrate through the engaging member for more heat dissipation and less luminance decrease of the SMD LED.

17 Claims, 17 Drawing Sheets

HEAT DISSIPATION STRUCTURE OF SMD LED

BACKGROUND OF THE INVENTION

The present invention relates to a heat dissipation structure of an LED (light emitting diode) bulb and, more particularly, to a high-luminance SMD (surface-mount device) LED module featuring high heat dissipation.

For high-intensive illumination from an LED bulb, most LED manufacturers fabricate high-power LEDs (e.g., K2 LEDs manufactured by Lumileds) with high-lumen chips installed as light sources. FIG. 1 illustrates a conventional K2 LED 10 including a thermal conductive copper rod 14 on a base 12, which is used to support an LED chip 15 and which transfers heat generated by LED chip 15 through a large-sized thermal conductive bottom 16 of copper rod 14, and a plurality of solder terminals 18 for electric conduction, heat transfer and heat dissipation.

To share the market of high lumen LEDs, the SMD manufacturers are developing SMD LEDs with compact, high-current and high-lumen chips which have more advantages including manufacturing equipment, modules and manufacturing cost than K2 LEDs and are easily processed. FIGS. 2 and 3 illustrate a conventional LED 20 in which a thermal conductive fiber insulating layer 24 is deposited on an upper end face of a metal substrate 22 and covered by a plurality of separated conductive copper foils 25, 25-1. Two electric/thermal conductive electrodes 28, 28-1, an anode and a cathode, are provided on a lower end face of an encased LED 26 and are respectively fixed on two conductive copper foils 25, 25-1 for development of a conductive path. As one component for heat dissipation, fiber insulating layer 24, with much less thermal conductivity than that of metal material, weakens heat transfer from conductive copper foils 25, 25-1 to metal substrate 22. Furthermore, LED 26 fixed on metal substrate 22 conducts electricity and heat through electrodes 28, 28-1 restrictively and performs much worse thermal dissipation than K2 LED 10 in FIG. 1. Moreover, thermal dissipation through the copper foils with coatings (e.g., white paint as an antioxidant) spread on their upper end faces is attenuated.

The first priority to promote SMD LEDs in end use is the properties such as lumen and illumination comparable to those of conventional bulbs. Furthermore, the SMD LED bulbs as alternatives of conventional bulbs should be shrunk compared with other conventional bulbs. Therefore, the SMD LED bulbs with their sizes competing with those of conventional bulbs must upgrade the properties such as lumen, illumination and structure, all of which are taken as pivotal roles in the prospect of SMD LEDs in end use, for effective heat dissipation conforming to the standard of luminance decrease of an LED.

It can be seen from above descriptions that an effective heat dissipation structure developed for SMD LEDs is the target of all LED manufacturers.

BRIEF SUMMARY OF THE INVENTION

For the above-mentioned issues, the present invention presents a heat dissipation structure of an SMD LED. The heat dissipation structure includes a substrate, at least one SMD LED, at least one engaging hole, and at least one engaging member. The substrate includes upper and lower end faces. A plurality of spaced copper foils is provided on the upper end face, and the lower end face is provided with at least one copper foil, a metal sheet, or a metal piece. The SMD LED includes a lower surface provided with two electrodes including an anode and a cathode and respectively connecting to two copper foils of the plurality of copper foils on the upper end face to form a conductive path. The engaging hole extends through one of the plurality of copper foils on the upper end face and through the upper and lower end faces of the substrate. The engaging member is made of thermal conductive metal and is engaged in the engaging hole. The engaging member includes an upper end engaged with the copper foil on the upper end face through which the engaging hole extends. The engaging member further includes a lower end engaged with the copper foil on the lower end face of the substrate, the metal sheet, or the metal piece.

In a preferred form, the engaging member is a rivet or a screw, and the engaging member is a hollow or solid body. The lower end face of the substrate is provided with the metal sheet hung under or horizontally mounted below the lower end face.

The present invention will become clearer in light of the following detailed description of illustrative embodiments of this invention described in connection with the drawings.

DESCRIPTION OF THE DRAWINGS

The illustrative embodiments may best be described by reference to the accompanying drawings where:

FIGS. 5 through 8a are schematic views illustrating SMD LED modules from second to fifth embodiments of the present invention.

FIG. 8b is a top view of the SMD LED module in FIG. 8a.

FIG. 8c is a bottom view of the SMD LED module in FIG. 8a.

FIG. 9b is a bottom view of the SMD LED module in FIG. 9a.

FIG. 23b is a bottom view of the SMD LED module in FIG. 23a.

FIG. 24b is a top view of the daytime running light in FIG. 24a.

DETAILED DESCRIPTION OF THE INVENTION

Figure 1:
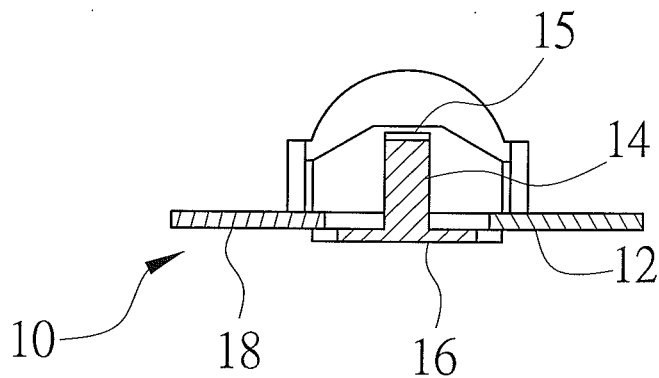
FIG. 1 is a schematic view of a conventional K2 LED.
Figure 2:
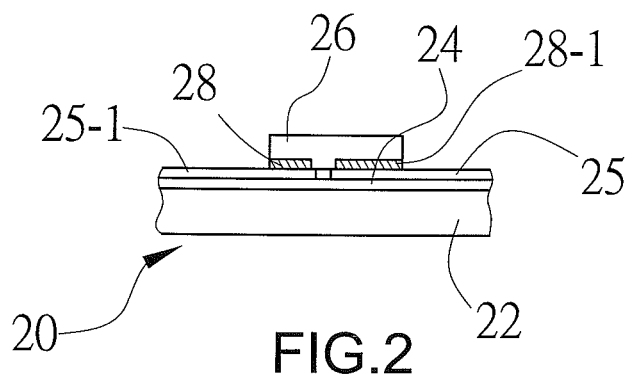
FIG. 2 is a schematic view of a conventional SMD LED.
Figure 3:
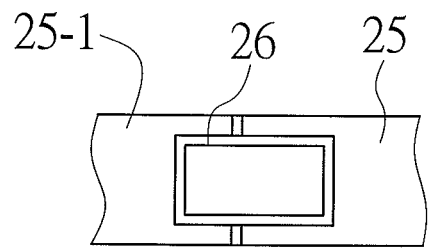
FIG. 3 is a top view of the SMD LED in FIG. 2.
Figure 4:
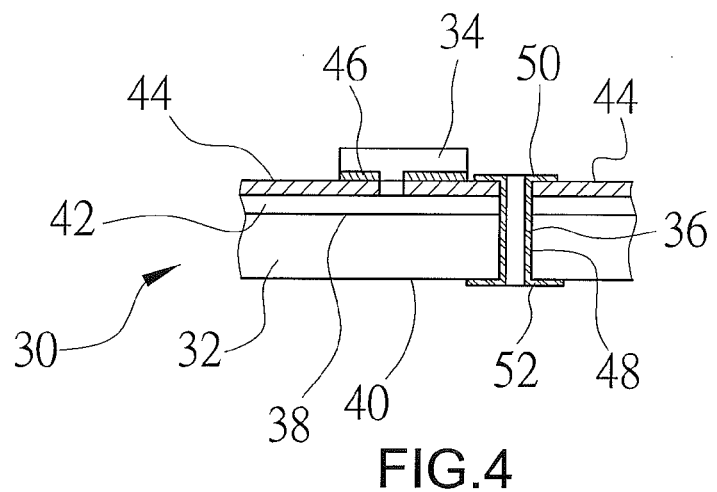
FIG. 4 is a schematic view illustrating an SMD LED module according to a first embodiment of the present invention.

An SMD (surface-mount device) LED (light emitting diode) module 30 and a heat dissipation structure thereof according to a first embodiment of the present invention are shown in FIG. 4. SMD LED module 30 includes a substrate 32, at least one SMD LED 34 (with an LED chip encapsulated therein) and at least one engaging member 36. Substrate 32 is a metal substrate including upper and lower end faces 38 and 40 opposed in a thickness direction. Upper end face 38 is covered with a thermal conductive fiber insulating layer 42, which creates a non-conductive status between substrate 32 and positive and negative electrodes of SMD LED 34, and is provided with a plurality of conductive copper foils 44 spaced from each other on an outer surface of fiber insulating layer 42. Two electric/thermal conductive electrodes 46 (an anode and a cathode) are provided on a lower surface of SMD LED 34 and are respectively connected to two of the plurality of conductive copper foils 44 for development of a conductive path. An engaging hole 48 extends through one of the plurality of conductive copper foils 44 adjacent to SMD LED 34 and through fiber insulating layer 42 and upper and lower end faces 38 and 40 of substrate 32 in the thickness direction.

Engaging member 36 made of high thermal conductive metal can be a hollow or solid body. In this embodiment, engaging member 36 is a hollow rivet and squeezed into engaging hole 48 to securely link copper foil 44, fiber insulating layer 42 and substrate 32. Upper and lower ends 50 and 52 of engaging member 36 are respectively formed as a connecting face and are respectively engaged with an upper surface of copper foil 44 and lower end face 40 of substrate 32. As such, heat generated by SMD LED 34 on copper foil 44 will be directly transferred to exposed lower end face 40 (on which no material is coated) of substrate 32 through engaging member 36 rather than low thermal conductive fiber insulating layer 42 for good heat dissipation with neither heat from the chip in SMD LED 34 accumulated in copper foil 44 as well as metal substrate 32 nor luminance decrease of an LED bulb. Moreover, there is no need to spread coatings on copper foils 44 and engaging member 36, both of which contact each other well. In another embodiment, engaging member 36 is a screw and is engaged in engaging hole 48 to securely link copper foil 44, fiber insulating layer 42 and substrate 32.

Figure 5:
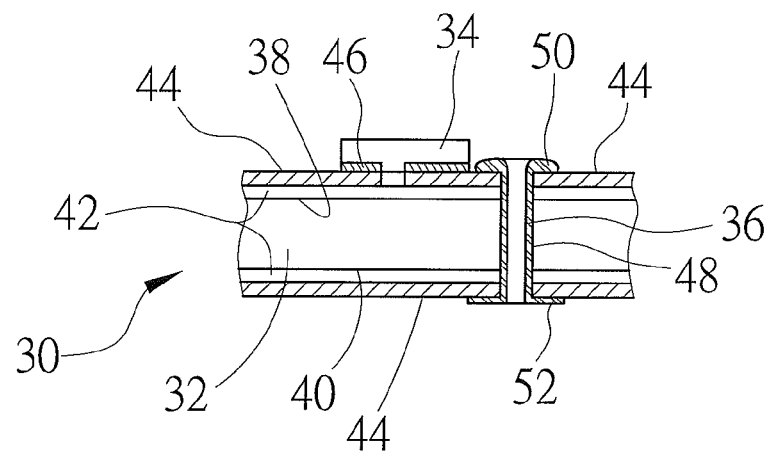

FIG. 5 illustrates an SMD LED module 30 and a heat dissipation structure thereof in a second embodiment of the present invention. Metal substrate 32 has upper and lower end faces 38 and 40 with fiber insulating layers 42 thereon, with each externally covered with a plurality of electric/thermal conductive copper foils 44. Copper foils 44 on lower end face 40 are totally exposed with no coating thereon. An engaging hole 48 is provided in one or more copper foils 44 adjacent to SMD LED 34 and extends through substrate 32, fiber insulating layers 42 and copper foils 44 on upper and lower end faces 38 and 40, all of which securely engage with one another through engaging member 36. As such, heat generated by the chip in SMD LED 34 is directly transferred to copper foils 44 on lower end face 40 from electrodes 46 through copper foils 44 on upper end face 38 and engaging member 36 for fast heat transfer and large-sized heat dissipation.

Figure 6:
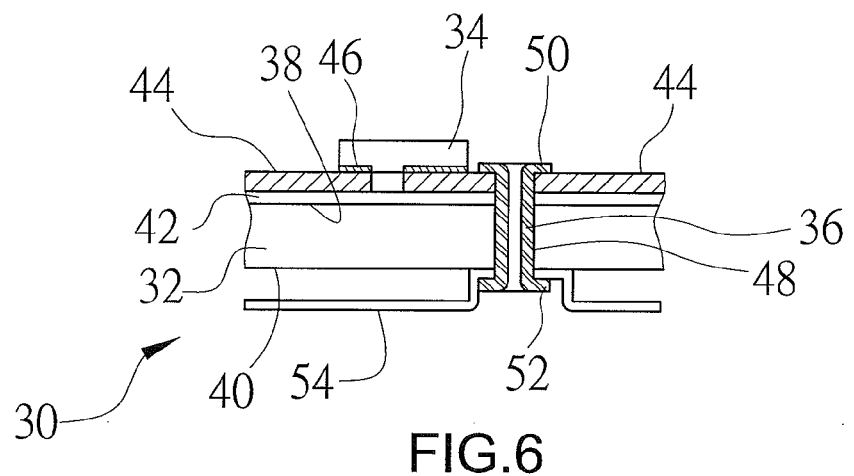

FIG. 6 illustrates an SMD LED module 30 and a heat dissipation structure thereof in a third embodiment of the present invention. A metal sheet 54 (e.g., copper sheet) is hung under lower end face 40 of substrate 32 in the first embodiment, and a lower end 52 of engaging member 36 engages with metal sheet 54. Upper and lower surfaces of metal sheet 54 are exposed to ambient environment for fast heat transfer and large-sized heat dissipation.

Figure 7:
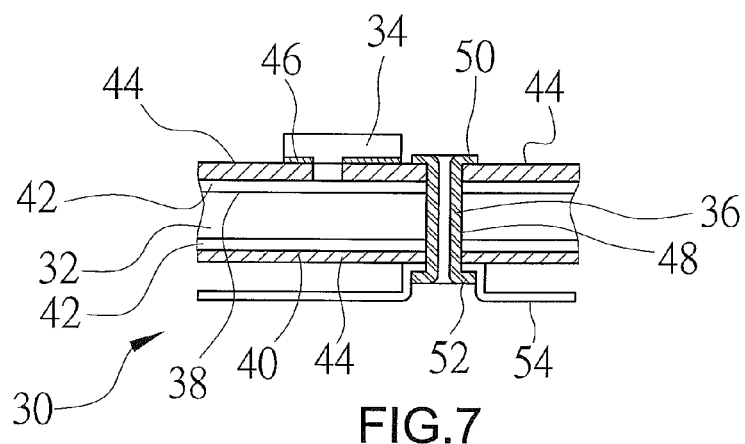

FIG. 7 illustrates an SMD LED module 30 and a heat dissipation structure thereof in a fourth embodiment of the present invention. A metal sheet 54 is hung under lower end face 40 of substrate 32 in the second embodiment, and a lower end 52 of engaging member 36 engages with metal sheet 54. Metal sheet 54 features its upper and lower end faces exposed to ambient environment for fast heat transfer and large-sized heat dissipation. Specially, heat generated by SMD LED 34 is transferred to upper end 50 of engaging member 36 via electrodes 46 and copper foils 44 and to metal sheet 54 hung under substrate 32 via engaging member 36 in engaging hole 48. A space is formed between metal sheet 54 and substrate 32, allowing the upper and lower surfaces of metal sheet 54 to be exposed to ambient environment for large-sized heat dissipation.

Figure 8A:
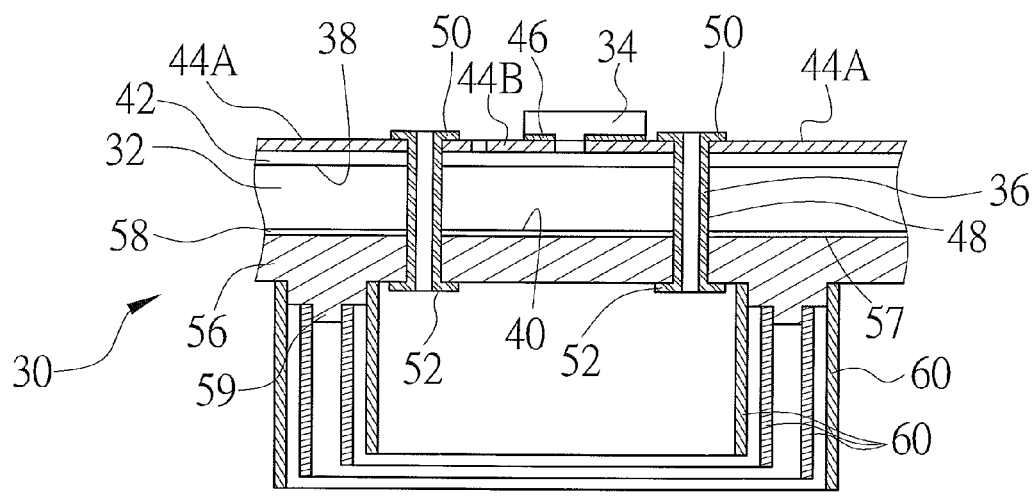
Figure 8B:
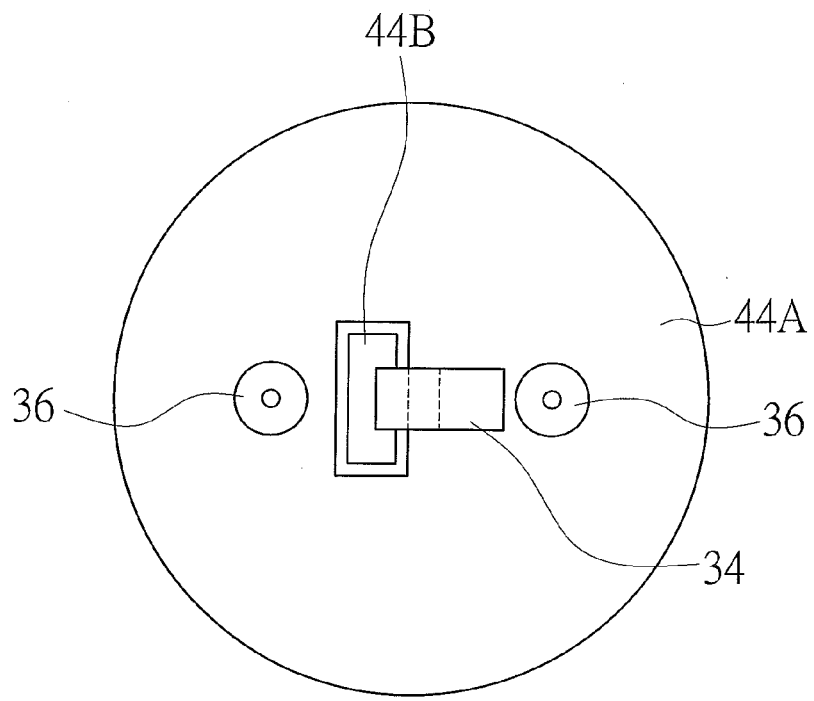
Figure 8C:
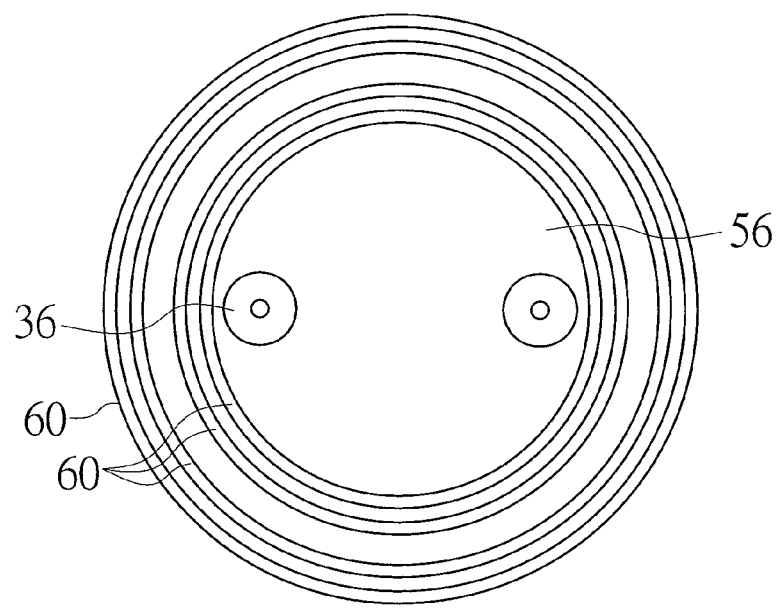

FIGS. 8a, 8b and 8c illustrate an SMD LED module 30 and a heat dissipation structure in a fifth embodiment of the present invention. In this embodiment, a metal piece 56 (e.g., copper piece) is horizontally mounted below lower end face 40 of substrate 32 in the first embodiment. Fiber insulating layer 42 is externally covered with a plurality of spaced copper foils 44A, 44B. Copper foils 44A, 44B, fiber insulating layer 42, substrate 32 and metal piece 56 are engaged with one another by a plurality of engaging members 36. An upper surface 57 of metal piece 56 horizontally adheres to lower end face 40 of substrate 32, and thermal paste 58 is filled in a gap between metal piece 56 and substrate 32. In addition, protrudent engaging portions 59 are provided on a bottom of metal piece 56 for installation of a plurality of radiating tubes 60 with distinct calibers for fast heat transfer and large-sized heat dissipation (radiating tubes 60 can be integrated with metal piece 56 as one unity).

Figure 9A:
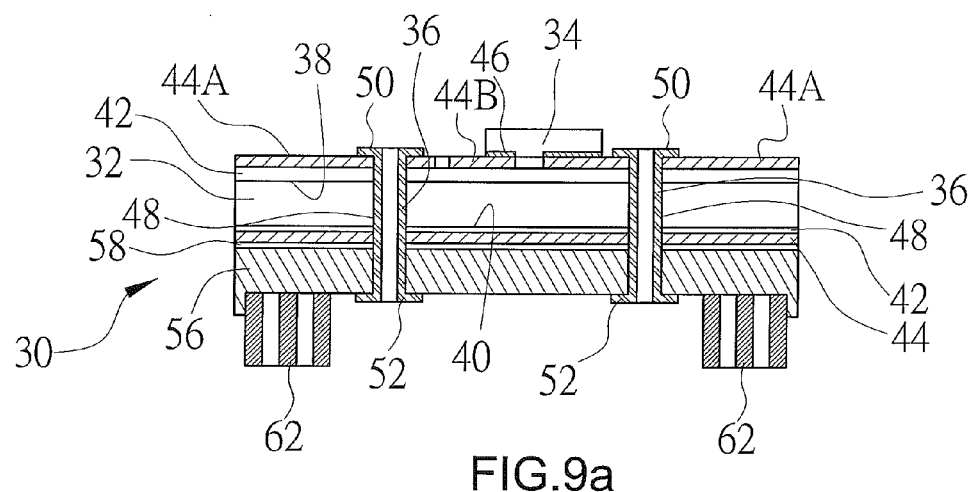
FIG. 9a is a schematic view of an SMD LED module according to a sixth embodiment of the present invention.
Figure 9B:
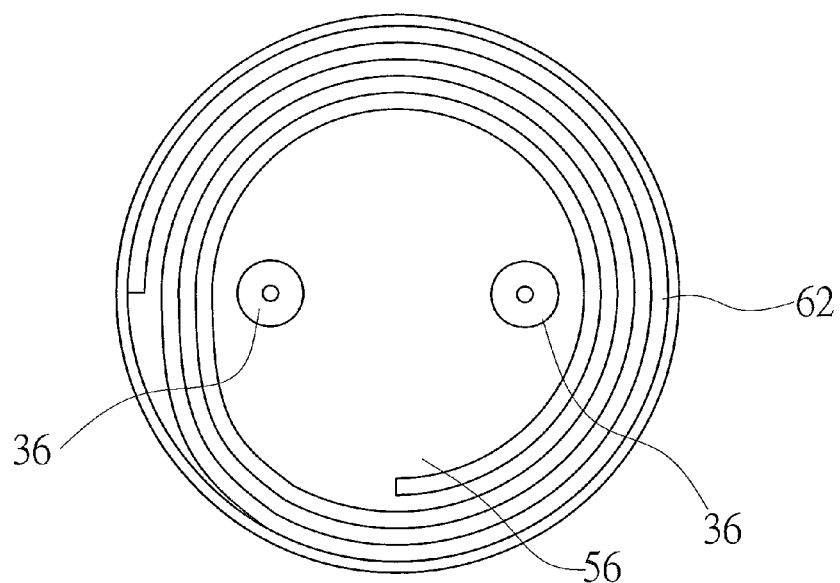

FIGS. 9a and 9b illustrate an SMD LED module 30 of a sixth embodiment of the present invention. A metal piece 56 is horizontally mounted below lower end face 40 of substrate 32 in the second embodiment and securely fixed by a plurality of engaging members 36 at their lower ends 52. Furthermore, a vortex-shaped radiating plate 62 is provided on a bottom of metal piece 56 for fast heat transfer and large-sized heat dissipation.

Figure 10A:
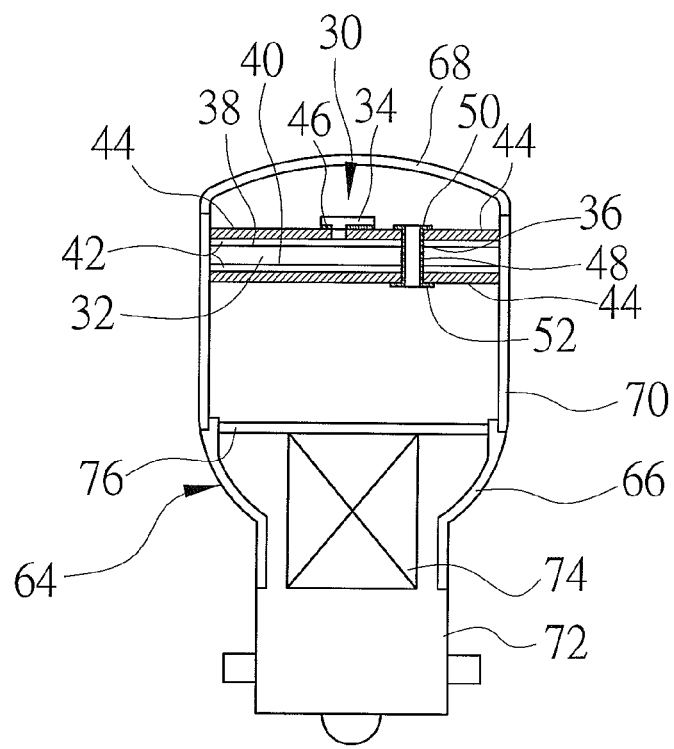
FIGS. 10a and 10b are schematic views illustrating the SMD LED module of the second embodiment used in an LED bulb.
Figure 10B:
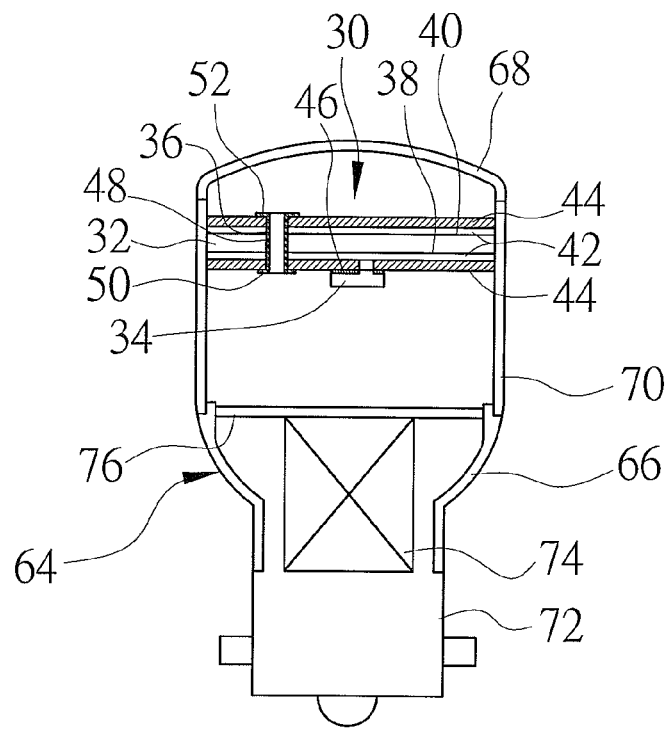
Figure 11A:
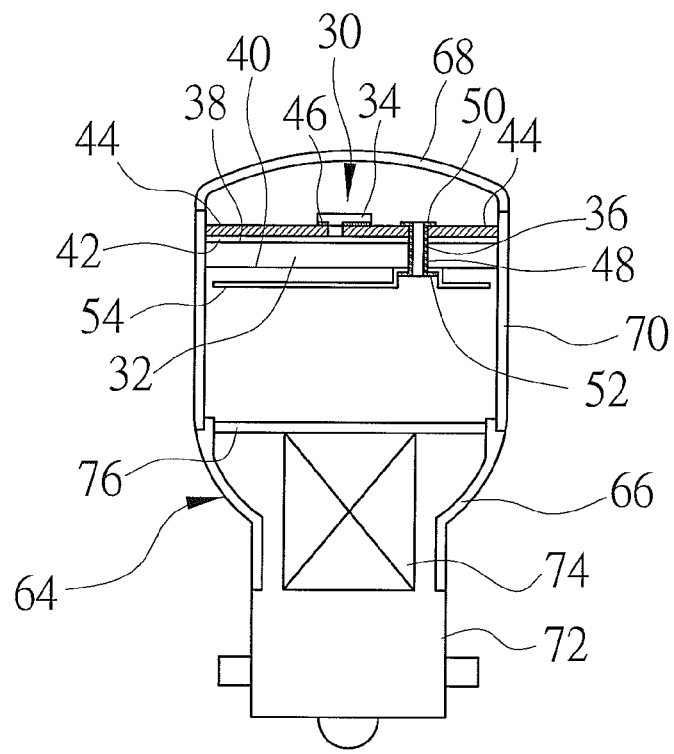
FIGS. 11a and 11b are schematic views illustrating the SMD LED module of the third embodiment used in an LED bulb.
Figure 11B:
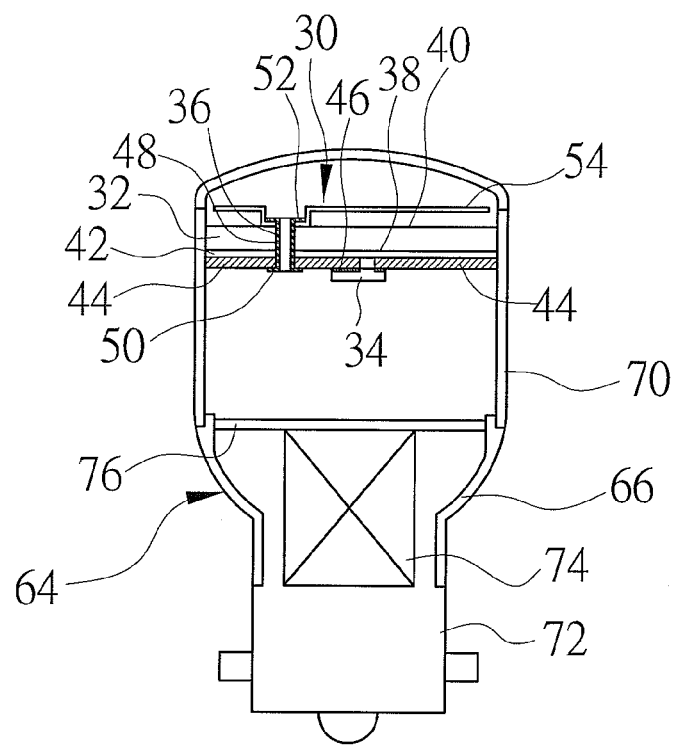
Figure 12A:
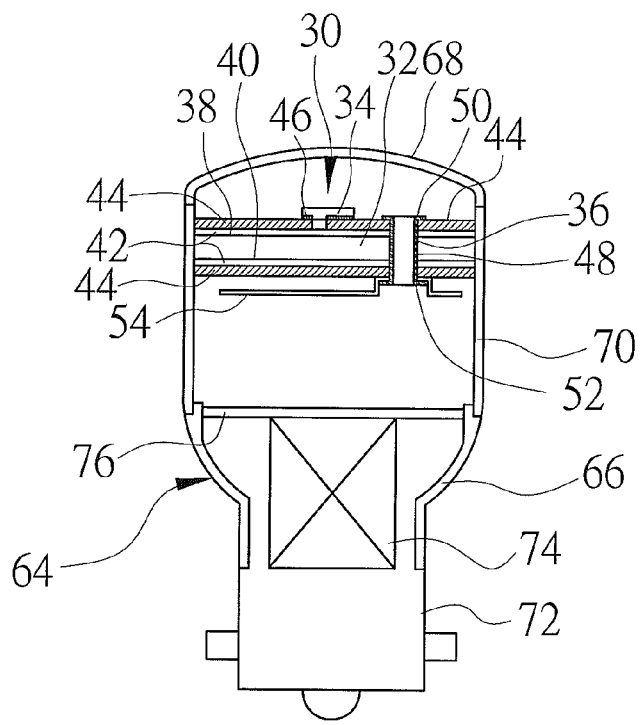
FIGS. 12a and 12b are schematic views illustrating the SMD LED module of the fourth embodiment used in an LED bulb.
Figure 12B:
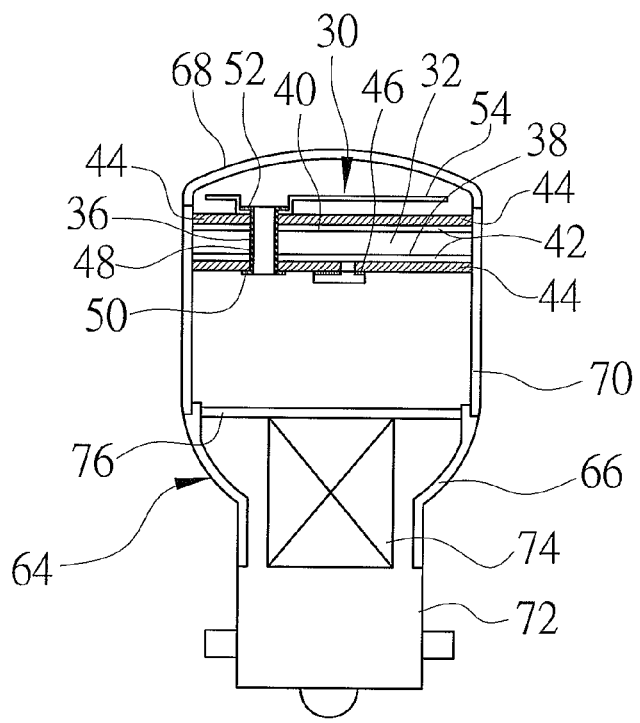
Figure 13A:
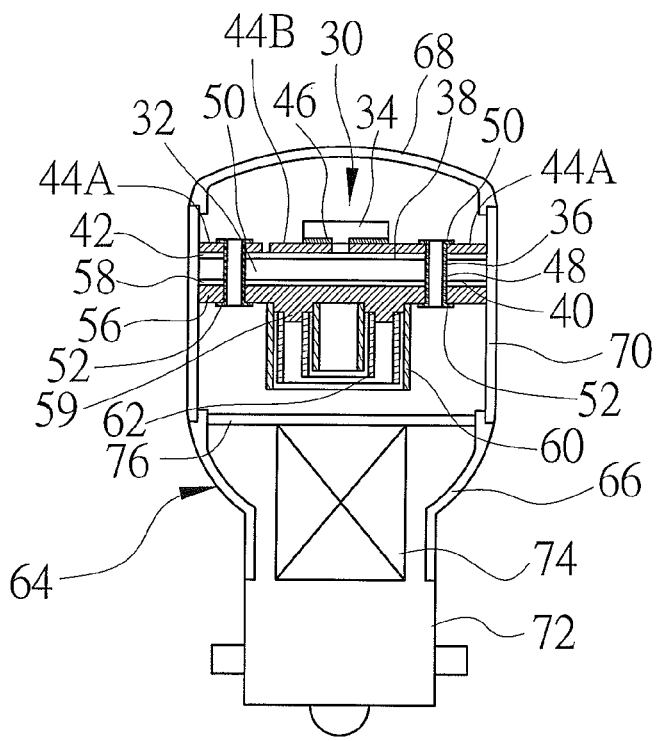
FIGS. 13a and 13b are schematic views illustrating the SMD LED module of the fifth embodiment used in an LED bulb.
Figure 13B:
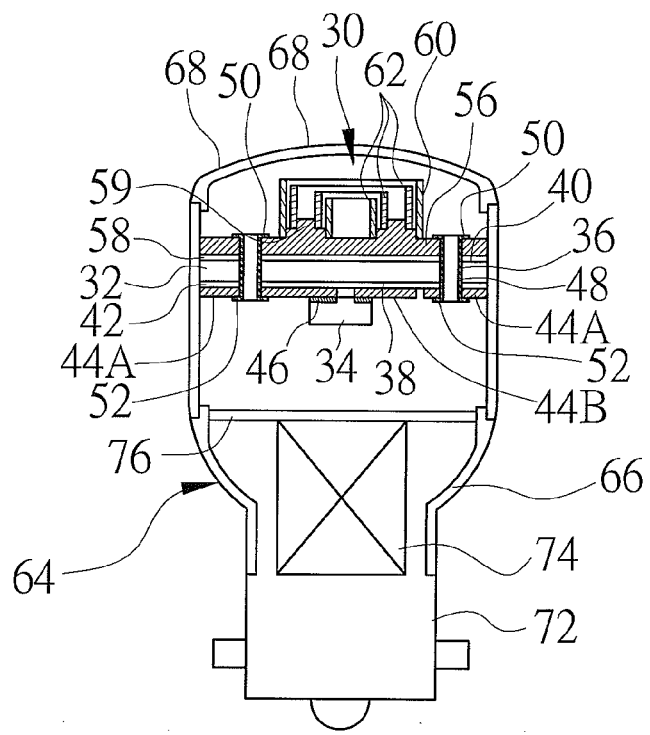
Figure 14A:
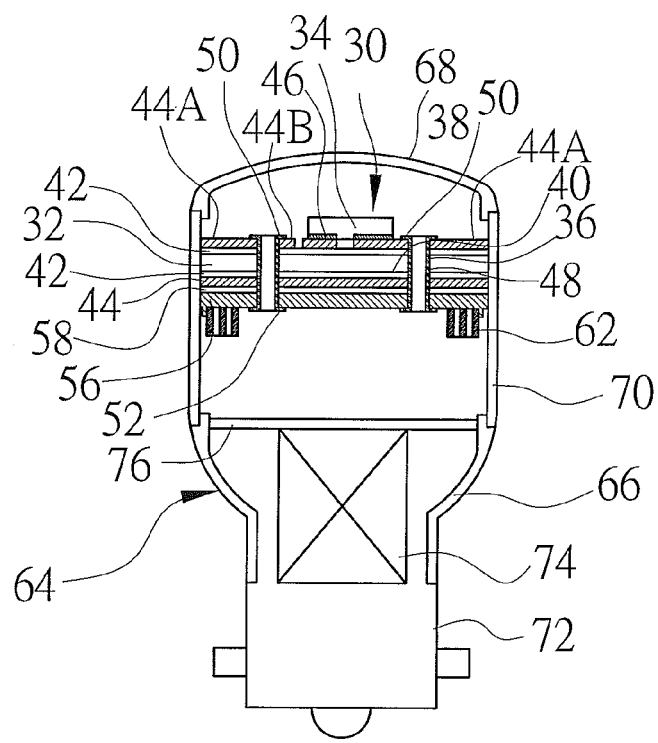
FIGS. 14a and 14b are schematic views illustrating the SMD LED module of the sixth embodiment used in an LED bulb.
Figure 14B:
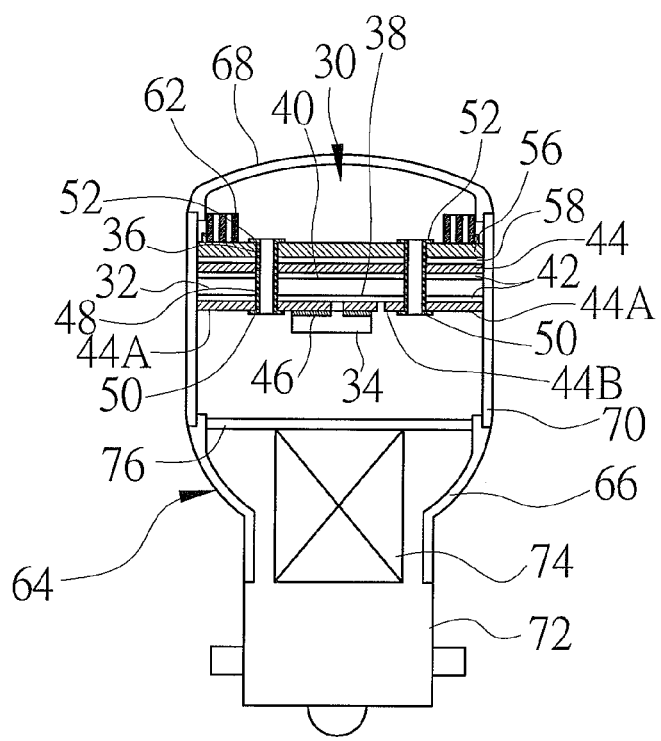
Figure 16:
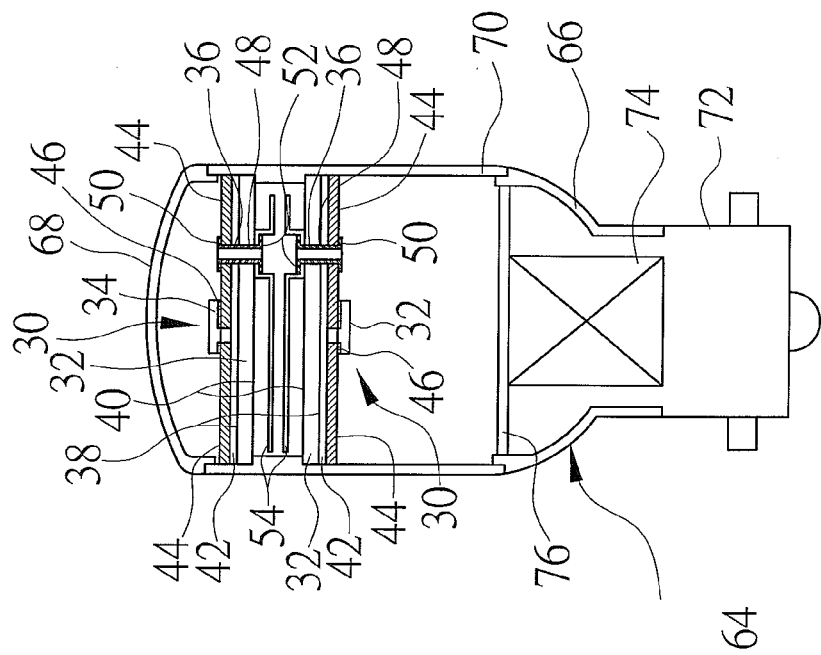
FIGS. 15 through 18 are schematic views illustrating LED bulbs of four embodiments each including any two SMD LED modules from the second to the fifth embodiments.
Figure 15:
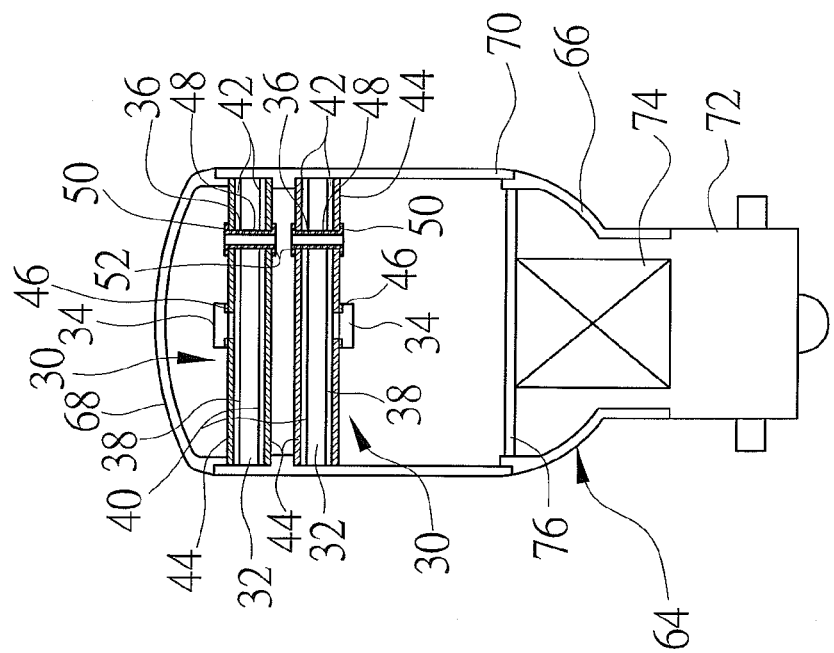
Figure 17:
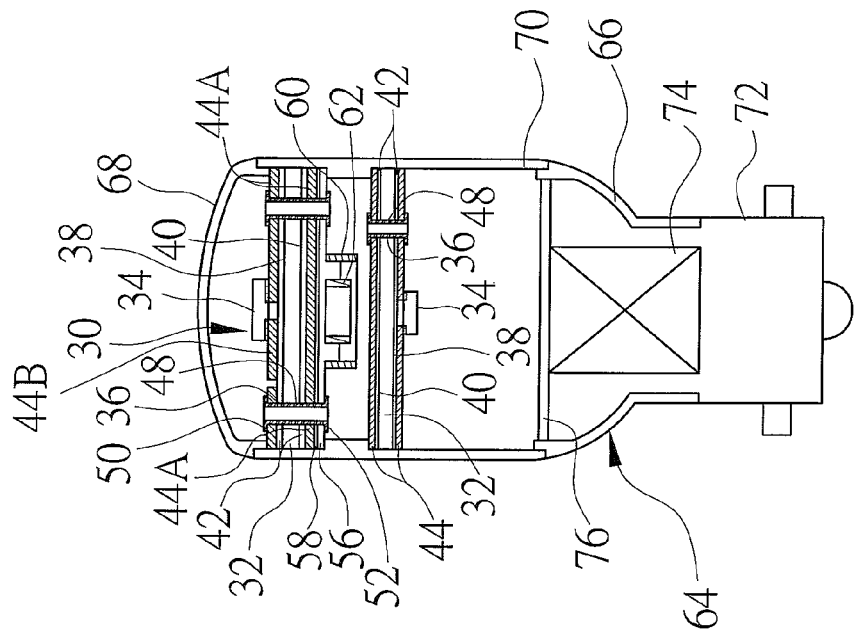
Figure 18:
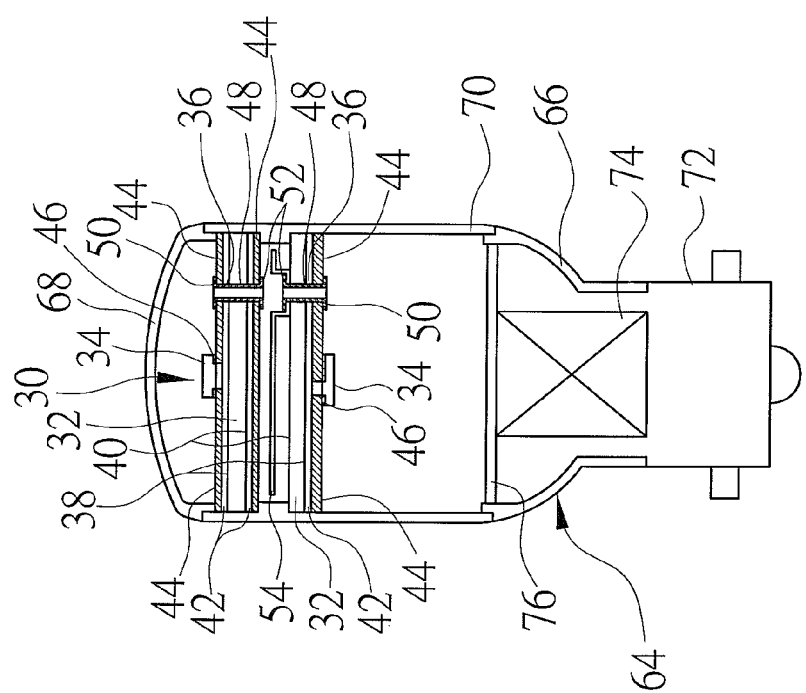

FIGS. 10a and 10b illustrate the SMD LED module 30 in the second embodiment which is used in a high-luminance LED bulb 64. LED bulb 64 includes a bulb base 66, a transparent shell 68 and a bulb holder 70 located between bulb base 66 and transparent shell 68. A lamp cap 72 is mounted on a lower end of bulb base 66, and an actuator 74 and a circuit board 76 are mounted in bulb base 66. SMD LED module 30 is installed in bulb holder 70 for development of a radiation unit which is electrically connected to actuator 74, so that SMD LED module 30 can be driven to project light toward transparent shell 68 (FIG. 10a) or lamp cap 72 (FIG. 10b). Heat generated by the radiation unit is directly transferred to lower end face 40 of metal substrate 32 through engaging member 36 for high heat transfer.

FIGS. 11a and 11b, FIGS. 12a and 12b, FIGS. 13a and 13b, and FIGS. 14a and 14b illustrate SMD LED modules 30 in the third, fourth, fifth, and sixth embodiments of the present invention, which are respectively installed in an LED bulb 64 and project light toward either transparent shell 68 or lamp cap 72.

FIGS. 15, 16, 17, and 18 illustrate LED bulbs 64 each including any two SMD LED modules 30 in the second through the sixth embodiments of the present invention, with one projecting light toward transparent shell 68 and the other projecting light toward lamp cap 72.

Figure 19:
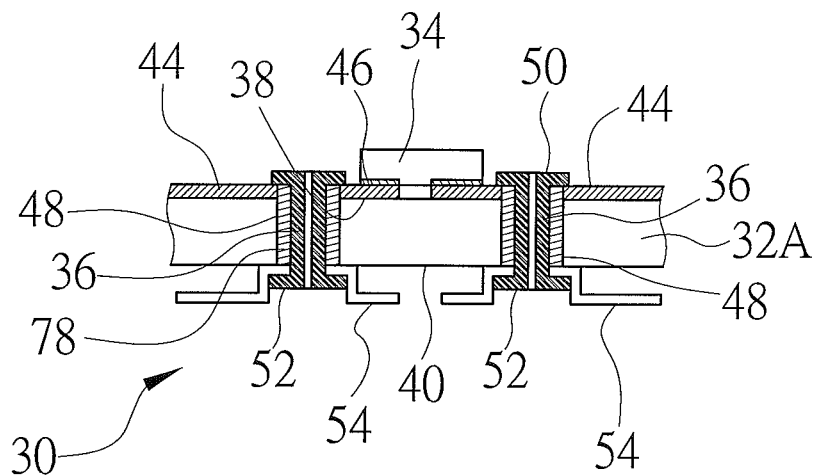
FIGS. 19 and 20 are schematic views illustrating SMD LED modules of seventh and eighth embodiments of the present invention.

FIG. 19 illustrates an SMD LED module 30 of a seventh embodiment of the present invention. SMD LED module 30 includes a substrate 32A, one or several SMD LEDs 34 and a plurality of engaging members 36. Substrate 32A is a fiber-based substrate including upper and lower end faces 38 and 40. A plurality of conductive copper foils 44 is provided on upper end face 38 and spaced by some gaps for no electric conduction therebetween. Each SMD LED 34 is provided with two electric/thermal conductive electrodes 46 underneath, an anode and a cathode, which are fixed on two spaced copper foils 44 for development of a conductive path. SMD LEDs 34 are electrically connected in series. A plurality of engaging holes 48 is provided in copper foils 44 adjacent to SMD LEDs 34, and each engaging hole 48 extends through copper foil 44 as well as upper and lower end faces 38 and 40 of substrate 32A. Each engaging hole 48 is internally covered with a thermal conductive metal layer 78. Engaging members 36 made of high thermal conductive metal are respectively squeezed into engaging holes 48 and link copper foils 44 and substrate 32A. A lower end 52 of each engaging member 36 links a metal sheet 54, so that metal sheets 54 are hung under substrate 32A. As such, heat generated by SMD LEDs 34 is directly transferred to metal sheets 54 through engaging members 36 for large-sized heat dissipation.

Figure 20:
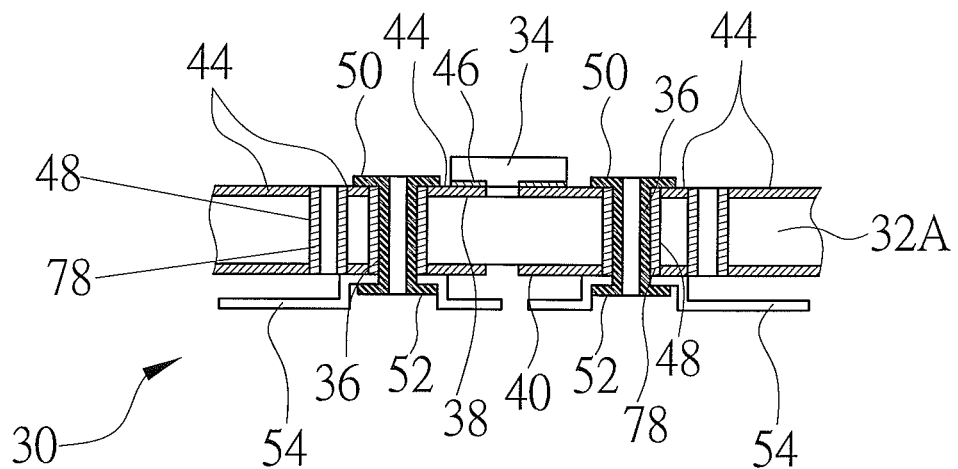
Figure 21A:
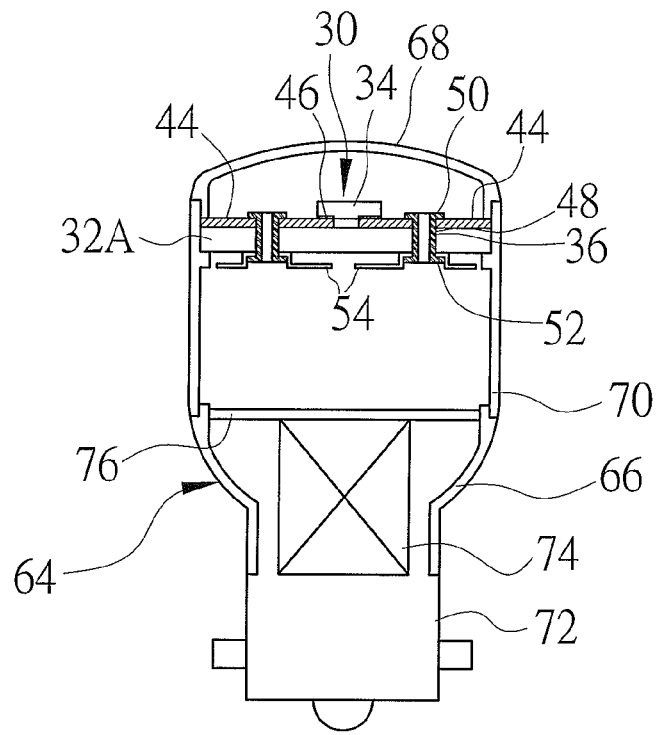
FIGS. 21a and 21b are schematic views illustrating the SMD LED module of the seventh embodiment used in an LED bulb.
Figure 21B:
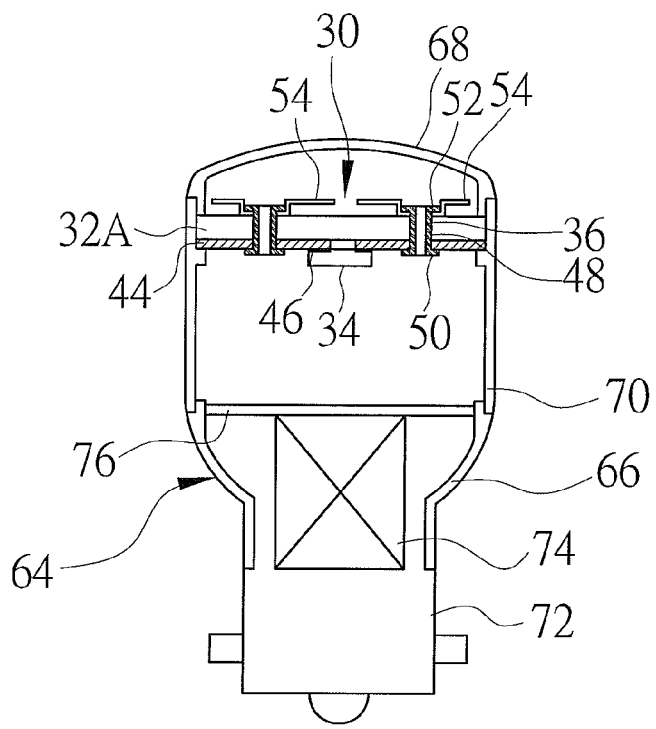
Figure 22A:
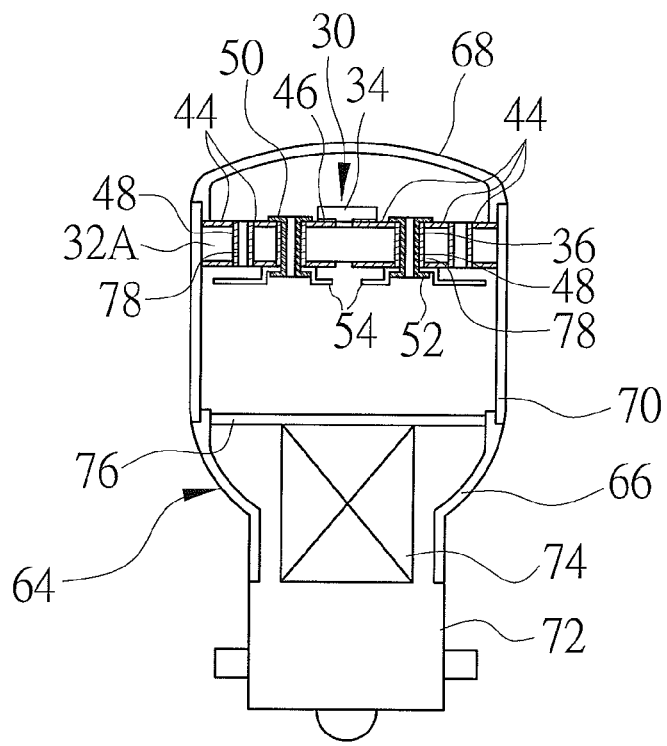
FIGS. 22a and 22b are schematic views illustrating the SMD LED module of the eighth embodiment used in an LED bulb.
Figure 22B:
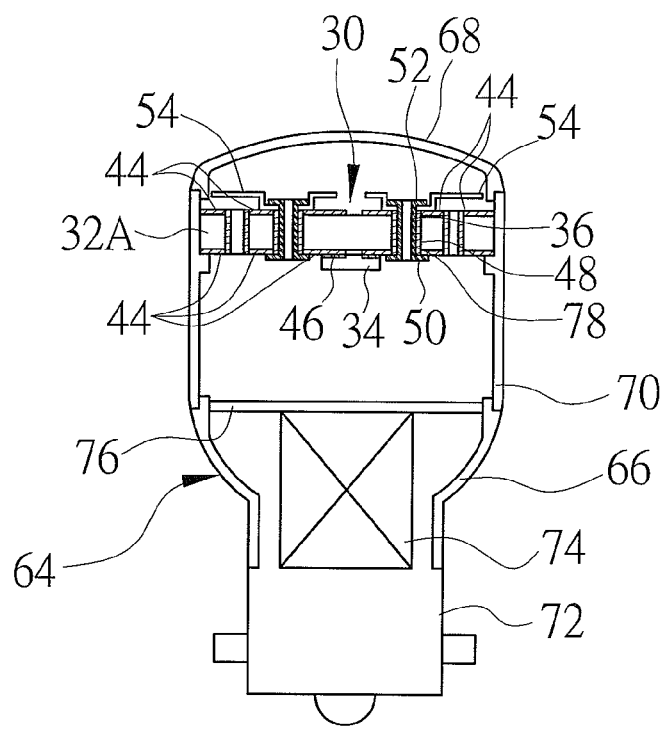

FIG. 20 illustrates an SMD LED module 30 of a eighth embodiment of the present invention. SMD LED module 30 includes a substrate 32A, one or several SMD LEDs 34, and a plurality of engaging members 36. Substrate 32A is a fiber-based substrate with upper and lower end faces 38 and 40 on which a plurality of copper foils 44 is provided respectively. Gaps are defined between copper foils 44 for no electric conduction. Each SMD LED 34 is provided with two electric/thermal conductive electrodes 46 underneath and which are fixed on two spaced copper foils 44 for development of a conductive path. A plurality of engaging holes 48 is provided in copper foils 44 adjacent to SMD LED 34, and each engaging hole 48 extends through upper and lower end faces 38 and 40 of substrate 32A. Each engaging hole 48 is internally covered with a thermal conductive metal layer 78 that makes copper foils 44 on upper and lower end faces 38 and 40 of substrate 32A remain thermal conductive to one another. As such, heat generated by SMD LEDs 34 is quickly transferred and dissipated through copper foils 44 on upper and lower end faces 38 and 40. Engaging members 36 are engaged in a portion of engaging holes 48 and connects copper foil 44 with substrate 32A. A lower end 52 of each engaging member 36 links a thermal conductive metal sheet 54 with an area similar to that of a copper foil 44, so that a number of metal sheets 54 hung under substrate 32A contribute to more heat being dissipated from the chip in SMD LED 34 through a greater area.

FIGS. 21a and 21b and FIGS. 22a and 22b illustrate SMD LED modules 30 in the seventh and eighth embodiment, which are respectively used in a LED bulb 64 and project light toward either transparent shell 68 or lamp cap 72.

Figure 23A:
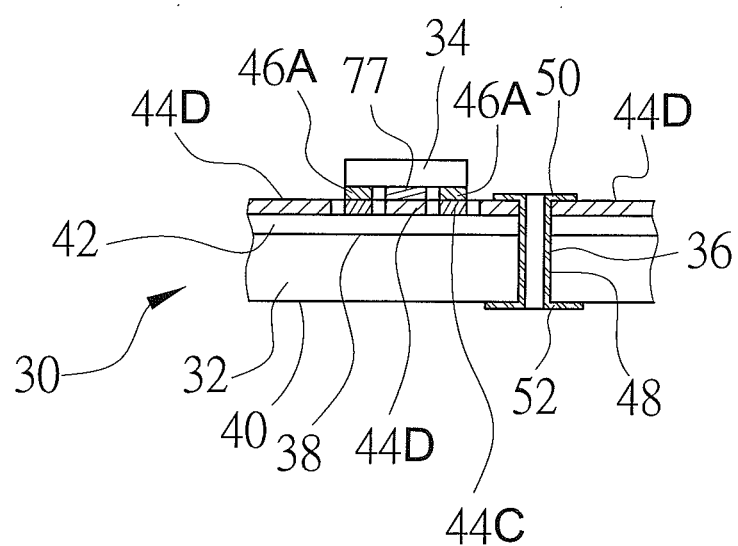
FIG. 23a is a schematic view of an SMD LED module according to a ninth embodiment of the present invention.
Figure 23B:
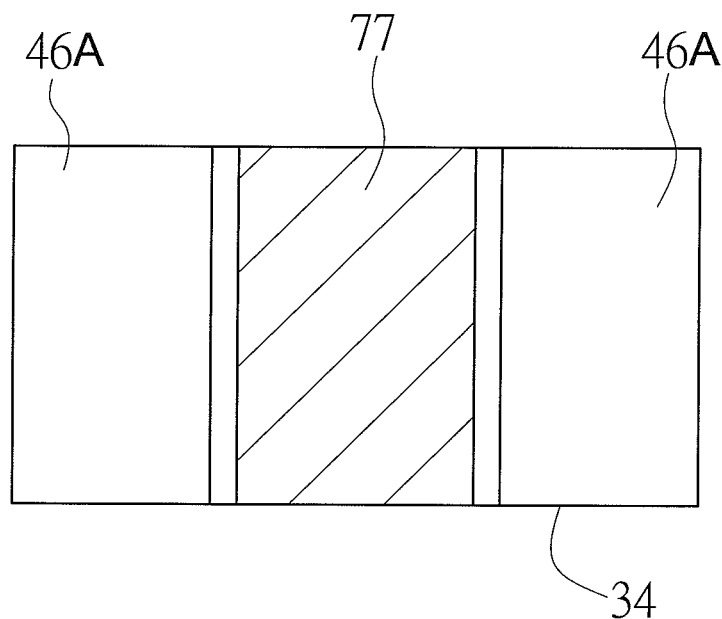

FIGS. 23a and 23b illustrate an SMD LED module 30 of a ninth embodiment of the present invention. SMD LED module 30 includes a substrate 32, at least one SMD LED 34, and at least one engaging member 36. A lower surface of SMD LED 34 is provided with two electric conductive electrodes 46A (positive and negative electrodes) and a thermal seat 77 located between and spaced from electrodes 46A. Two electric conductive copper foils 44C spaced from each other are provided on an outer surface of fiber insulating layer 42 and are respectively connected to electrodes 46A for development of a conductive path. At least one thermal conductive copper foil 44D is provided on the outer surface of fiber insulating layer 42 and contacts with thermal seat 77. At least one engaging hole 48 is provided in copper foil 44D adjacent to SMD LED 34 and extends through copper foil 44D, fiber insulating layer 42, and upper and lower end faces 38 and 40 of substrate 32. Engaging member 36 is engaged in engaging holes 48 and connects copper foil 44D with substrate 32. As such, engaging holes 48 will not be restricted in unipolar copper foils, and heat generated by SMD LED 34 is transferred to upper end 50 of engaging member 36 via thermal seat 77 and copper foils 44D and to lower end face 40 of substrate 32 via engaging member 36 in engaging hole 48 for large-sized heat dissipation.

Figure 24B:
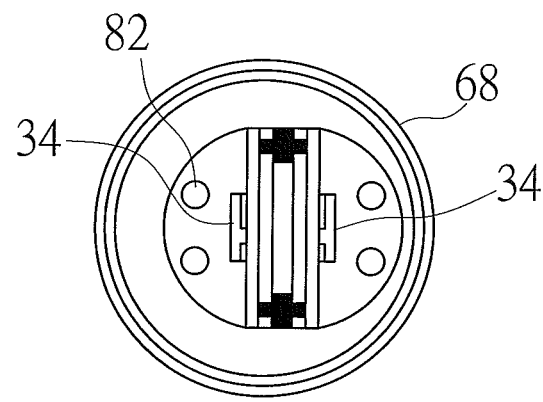
Figure 24A:
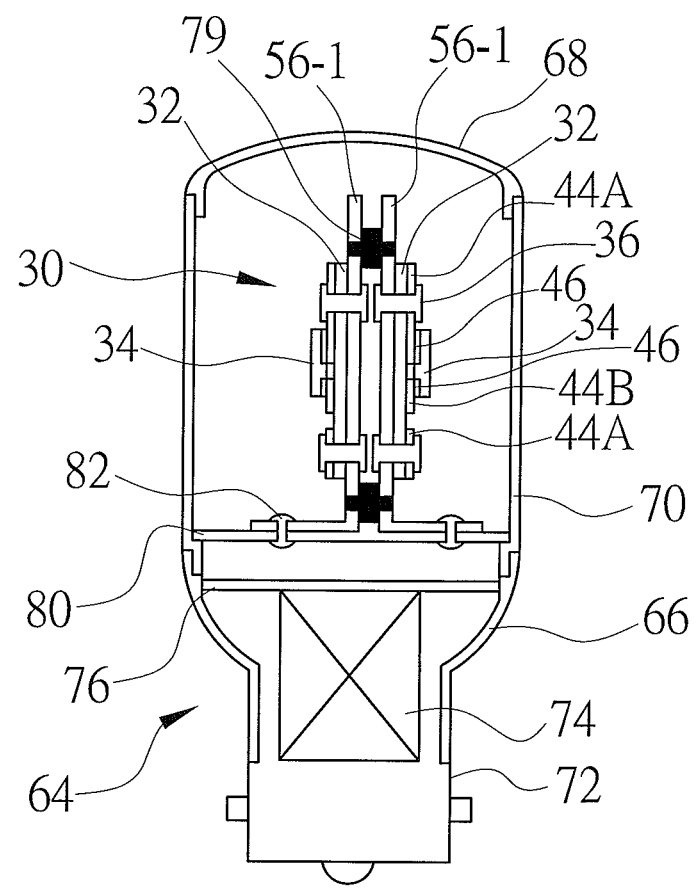
FIG. 24a is a schematic view illustrating an SMD LED module according to a tenth embodiment of the present invention which is used in an LED daytime running light.

FIGS. 24a and 24b illustrate an SMD LED module 30 of a tenth embodiment of the present invention, which is used in an LED bulb 64 of a daytime running light. FIG. 24a presents a support plate 80 above a circuit board 76 in a bulb holder 70, two L-shaped support metal pieces 56-1 which are opposite to each other and fixed on support plate 80 by engaging members 82, a holder 79 between metal pieces 56-1, and two substrates 32 respectively installed on external surfaces of metal pieces 56-1. An SMD LED 34 on the left-hand side of FIG. 24a will project direct light toward a vehicle's travel direction and contribute to a driver's line of sight. An SMD LED 34 on the right-hand side of FIG. 24a will radiate light which is projected toward a driver's seat, reflected toward the vehicle's travel direction (reflected angle is about 35 degrees for left and right sides) and cast on running motorcycles or pedestrians outside a driving lane for a driver's observation. Metal pieces 56-1 feature their end faces contacting and supporting substrates 32 for more heat being widely transferred and dissipated from the chip in SMD LEDs 34.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

The invention claimed is:
1. A heat dissipation structure of a surface mount device light emitting diode (SMD LED), comprising:
 a fiber-based substrate including upper and lower end faces, with a plurality of spaced copper foils provided on the upper end face, with the lower end face provided with a metal sheet hung under or horizontally mounted below the lower end face;

at least one SMD LED including a lower surface provided with two electrodes, with the two electrodes including an anode and a cathode and respectively connecting to two copper foils of the plurality of copper foils on the upper end face to form a conductive path;

at least one engaging hole extending through one of the plurality of copper foils on the upper end face and through the upper and lower end faces of the fiber-based substrate, with the at least one engaging hole internally covered with a thermal conductive metal layer; and at least one engaging member made of thermal conductive metal and engaged in the at least one engaging hole, with the at least one engaging member including an upper end engaged with the one of the plurality of copper foils on the upper end face through which the at least one engaging hole extends, with the at least one engaging member further including a lower end engaged with both the at least one copper foil and the metal sheet on the lower end face of the fiber-based substrate, with the metal sheet including opposite first and second surfaces, with the metal sheet being thermally insulated from the lower end face with at least one of the first and second surfaces exposed to ambient environment, and wherein a space is defined by the first surface of the metal sheet and the lower end face, with the first surface in the space and the second surface exposed to the ambient environment.

2. The heat dissipation structure as claimed in claim 1, wherein the at least one engaging member is a rivet or a screw, with the at least one engaging member including a plurality of engaging members, with the at least one engaging hole including a plurality of engaging holes, with each engaging hole internally covered with the thermal conductive metal layer, with the plurality of engaging members engaged in a portion of the plurality of engaging holes.

3. A heat dissipation structure of a surface mount device light emitting diode (SMD LED) comprising:

a substrate including upper and lower end faces, with a plurality of spaced copper foils provided on the upper end face, with the lower end face provided with a metal piece;

at least one SMD LED including a lower surface provided with two electrodes, with the two electrodes including an anode and a cathode and respectively connecting to two copper foils of the plurality of copper foils on the upper end face to form a conductive path;

an engaging hole extending through one of the plurality of copper foils on the upper end face and through the upper and lower end faces of the substrate; and an engaging member made of thermal conductive metal and engaged in the engaging hole, with the engaging member including an upper end engaged with the copper foil on the upper end face through which the engaging hole extends, with the engaging member further including a lower end, with the metal piece including opposite first and second surfaces, with the metal piece being thermally insulated from the lower end face with at least one of the first and second surfaces exposed to ambient environment wherein the metal piece comprises a metal sheet, wherein a space is defined by the first surface of the metal sheet and the lower end face, with the first surface in the space and the second surface exposed to the ambient environment, and wherein the lower end of the engaging member engages with the metal piece.

4. The heat dissipation structure as claimed in claim 3, wherein the lower end of the engaging member engages with the metal sheet, with portions of the first and second surfaces being parallel to and spaced from the lower end face.

5. The heat dissipation structure as claimed in claim 4, further comprising a copper foil on the lower end face and intermediate the substrate and the metal sheet.

6. The heat dissipation structure as claimed in claim 5, further comprising a first insulating layer intermediate the upper end face and the plurality of spaced copper foils.

7. The heat dissipation structure as claimed in claim 6, further comprising a second insulating layer intermediate the lower end face and the copper foil.

8. The heat dissipation structure as claimed in claim 7, wherein the engaging member is a rivet or a screw, with the engaging member being a hollow or solid body.

9. The heat dissipation structure as claimed in claim 5, further comprising a thermal conductive metal layer intermediate the engaging hole and the engaging member.

10. The heat dissipation structure as claimed in claim 4, further comprising a first insulating layer intermediate the upper end face and the plurality of spaced copper foils.

11. The heat dissipation structure as claimed in claim 10, further comprising a thermal conductive metal layer intermediate the engaging hole and the engaging member.

12. The heat dissipation structure as claimed in claim 3, wherein the lower surface of the SMD LED is further provided with a thermal seat located between and spaced from the two electrodes, with the plurality of copper foils on the upper end face including two electric conductive copper foils respectively connected to the two electrodes, with the plurality of copper foils on the upper end face further including a thermal conductive copper foil contacting with the thermal seat, with the engaging hole extending through the thermal conductive copper foil and the upper and lower end faces of the substrate.

13. The heat dissipation structure as claimed in claim 3, further comprising a first insulating layer intermediate the upper end face and the plurality of spaced copper foils, with the lower end in electrical contact with the metal piece.

14. The heat dissipation structure as claimed in claim 13, further comprising a second insulating layer intermediate the lower end face and the metal piece.

15. The heat dissipation structure as claimed in claim 3, further comprising a first insulating layer intermediate the upper end face and the plurality of spaced copper foils.

16. The heat dissipation structure as claimed in claim 15, further comprising a second insulating layer intermediate the lower end face and the metal piece.

17. The heat dissipation structure as claimed in claim 3, with the lower end face provided with at least one copper foil horizontally mounted below the lower end face, with the lower end engaged with the at least one copper foil on the lower end face of the fiber-based substrate.

* * * * *